United States Patent
Choi et al.

(10) Patent No.: US 9,184,222 B2
(45) Date of Patent: Nov. 10, 2015

(54) METHOD OF MANUFACTURING AN ORGANIC LIGHT-EMITTING DISPLAY DEVICE

(71) Applicant: Samsung Display Co., Ltd., Yongin, Gyeonggi-do (KR)

(72) Inventors: Jong-Hyun Choi, Yongin (KR); Jae-Hwan Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/632,772

(22) Filed: Feb. 26, 2015

(65) Prior Publication Data

US 2015/0171152 A1    Jun. 18, 2015

Related U.S. Application Data

(62) Division of application No. 13/309,448, filed on Dec. 1, 2011, now Pat. No. 9,000,523.

(30) Foreign Application Priority Data

Jun. 28, 2011 (KR) ........................ 10-2011-0063035

(51) Int. Cl.
| | | |
|---|---|---|
| *H01L 27/12* | (2006.01) | |
| *H01L 27/32* | (2006.01) | |
| *H01L 51/05* | (2006.01) | |
| *H01L 29/417* | (2006.01) | |

(Continued)

(52) U.S. Cl.
CPC ........ *H01L 27/3262* (2013.01); *H01L 27/3274* (2013.01); *H01L 27/3276* (2013.01); *H01L 29/41733* (2013.01); *H01L 29/66765* (2013.01); *H01L 51/0512* (2013.01); *H01L 51/56* (2013.01); *H01L 27/3248* (2013.01); *H01L 51/0508* (2013.01); *H01L 51/0541* (2013.01);

(Continued)

(58) Field of Classification Search
CPC ............ H01L 27/3262; H01L 27/3274; H01L 29/41733; H01L 51/0508; H01L 51/0512; H01L 51/0541; H01L 51/56; H01L 2227/32; H01L 2924/13069; H01L 2924/1307
See application file for complete search history.

(56) References Cited

U.S. PATENT DOCUMENTS

| | | |
|---|---|---|
| 2005/0110023 A1 | 5/2005 | Lee et al. |
| 2006/0081845 A1 | 4/2006 | Bae |

(Continued)

FOREIGN PATENT DOCUMENTS

| | | |
|---|---|---|
| KR | 10-2002-0023540 A | 3/2002 |
| KR | 10-2006-0033240 | 4/2006 |
| KR | 10-2011-0052950 | 5/2011 |

*Primary Examiner* — Eduardo A Rodela
*Assistant Examiner* — Christopher M Roland
(74) *Attorney, Agent, or Firm* — Christie, Parker & Hale, LLP

(57) ABSTRACT

An organic light-emitting display device including a TFT comprising an active layer, a gate electrode comprising a lower gate electrode and an upper gate electrode, and source and drain electrodes insulated from the gate electrode and contacting the active layer; an organic light-emitting device electrically connected to the TFT and comprising a pixel electrode formed in the same layer as where the lower gate electrode is formed; and a pad electrode electrically coupled to the TFT or the organic light emitting device and comprising a first pad electrode formed in the same layer as in which the lower gate electrode is formed, a second pad electrode formed in the same layer as in which the upper gate electrode is formed, and a third pad electrode comprising a transparent conductive oxide, the first, second, and third pad electrodes being sequentially stacked.

9 Claims, 8 Drawing Sheets

(51) Int. Cl.
*H01L 29/66* (2006.01)
*H01L 51/56* (2006.01)

(52) U.S. Cl.
CPC ....... *H01L 2227/32* (2013.01); *H01L 2227/323* (2013.01); *H01L 2924/1307* (2013.01); *H01L 2924/13069* (2013.01)

(56) References Cited

U.S. PATENT DOCUMENTS

| | | | |
|---|---|---|---|
| 2006/0125389 A1 | 6/2006 | Song et al. | |
| 2006/0269786 A1 | 11/2006 | Shin et al. | |
| 2006/0290829 A1 | 12/2006 | Kim | |
| 2007/0002222 A1 | 1/2007 | Lim et al. | |
| 2009/0278131 A1* | 11/2009 | Kwon et al. | 257/72 |
| 2010/0127249 A1* | 5/2010 | Kim et al. | 257/40 |
| 2010/0193790 A1 | 8/2010 | Yeo et al. | |
| 2011/0114956 A1 | 5/2011 | Park et al. | |
| 2012/0139000 A1* | 6/2012 | Lee et al. | 257/99 |
| 2012/0286281 A1* | 11/2012 | You | 257/72 |
| 2013/0015456 A1* | 1/2013 | You | 257/71 |

* cited by examiner

METHOD OF MANUFACTURING AN ORGANIC LIGHT-EMITTING DISPLAY DEVICE

CROSS-REFERENCE TO RELATED PATENT APPLICATION

This application is a divisional of U.S. patent application Ser. No. 13/309,448, filed on Dec. 1, 2011, entitled "ORGANIC LIGHT-EMITTING DISPLAY DEVICE," which claims priority to and the benefit of Korean Patent Application No. 10-2011-0063035, filed on Jun. 28, 2011, in the Korean Intellectual Property Office, the disclosures of both of which are incorporated herein in their entirety by reference.

BACKGROUND

1. Field

The following description relates to an organic light-emitting display device and a method of manufacturing the organic light-emitting display device, and more particularly, to an organic light-emitting display device that is simple to manufacture and includes a pad portion with increased corrosion-resistance and reduced resistance, and a method of manufacturing the organic light-emitting display device.

2. Description of Related Art

Flat panel displays such as organic light-emitting display devices and liquid crystal displays (LCDs) are manufactured on a substrate on which a pattern including a thin film transistor (TFT), a capacitor, and wiring connecting the TFT to the capacitor is formed. In general, to form a fine pattern including the TFT and the like, the fine pattern is transferred to a substrate used to manufacture a flat panel display, by using a mask on which the fine pattern is drawn.

However, in a process of transferring a pattern by using a mask, a mask on which a necessary pattern is drawn is first prepared. Thus, as the number of processes using a mask increases, the manufacturing costs for preparing for the use of masks increases. Moreover, the manufacturing process is complicated due to the above-described complicated processes, and a manufacturing time is increased, leading to an increase in manufacturing costs.

SUMMARY

An aspect of an embodiment of the present invention is directed toward an organic light-emitting display device that is simple to manufacture and includes a pad portion with increased corrosion-resistance and reduced resistance, and a method of manufacturing the organic light-emitting display device.

According to an embodiment of the present invention, there is provided an organic light-emitting display device comprising: a thin film transistor (TFT) comprising an active layer and a gate electrode insulated from the active layer and comprising a lower gate electrode and an upper gate electrode, and the TFT further comprising a source electrode and a drain electrode both insulated from the gate electrode and contacting the active layer; an organic light-emitting device electrically connected to the TFT and comprising a pixel electrode formed in the same layer as the layer where the lower gate electrode is formed, an intermediate layer including an emission layer, and an opposite electrode, wherein the pixel electrode, the intermediate layer, and the opposite electrode are sequentially stacked; and a pad electrode electrically coupled to the TFT or the organic light emitting device and comprising a first pad electrode formed in the same layer as the layer in which the lower gate electrode is formed, a second pad electrode formed in the same layer as the layer in which the upper gate electrode is formed, and a third pad electrode comprising a transparent conductive oxide, wherein the first, second, and third pad electrodes are sequentially stacked.

The organic light-emitting display device may further comprise at least one insulation layer covering the gate electrode and the pad electrode, wherein the insulation layer has a hole that does not expose an edge of the pad electrode and exposes at least a center portion of the pad electrode.

A portion of the pad electrode exposed via the hole may be electrically connected to a driver integrated circuit (IC) which supplies a current, in order to drive the organic light-emitting display device.

The source electrode and the drain electrode may be arranged on an upper surface of the at least one insulation layer.

The third pad electrode may comprise polycrystal indium tin oxide (p-ITO).

The lower gate electrode, the pixel electrode, and the first pad electrode may comprise a transparent conductive oxide.

The upper gate electrode and the second pad electrode may comprise at least one selected from among silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu).

The organic light-emitting display device may further comprise a capacitor comprising a lower capacitor electrode formed in the same layer as the layer in which the active layer is formed and an upper capacitor electrode formed in the same layer as the layer in which the gate electrode is formed, the capacitor electrically coupled to the TFT.

According to another embodiment of the present invention, there is provided a method of manufacturing an organic light-emitting display device, the method comprising a first mask process of forming an active layer of a thin film transistor (TFT) on a substrate; a second mask process of sequentially stacking a first insulation layer, a first conductive layer, a second conductive layer, and a third conductive layer on an upper surface of the active layer and then patterning the first conductive layer, the second conductive layer, and the third conductive layer to form a gate electrode (including the first conductive layer that serves as a lower gate electrode and the second conductive layer that serves as an upper gate electrode), a first electrode pattern (including the first and second conductive layers), and a pad electrode (including the first conductive layer that serves as a first pad electrode, the second conductive layer that serves as a second pad electrode, and the third conductive layer that serves as a third pad electrode); a third mask process of forming a second insulation layer on upper surfaces of the gate electrode, the first electrode pattern, and the pad electrode and then forming holes exposing a part of the active layer via patterning of the first and second insulation layers and holes exposing at least a part of the first electrode pattern and the pad electrode via patterning of the second insulation layer; a fourth mask process of forming a source electrode and a drain electrode that contact the active layer via the holes and forming a pixel electrode from the first electrode pattern; and a fifth mask process of forming a pixel definition layer exposing at least a part of the pixel electrode.

The second mask process may comprise sequentially stacking the first insulation layer, the first conductive layer, the second conductive layer, and the third conductive layer on the upper surface of the active layer; forming a first photosensitive layer pattern having a first thickness in a first region corresponding to the gate electrode and the first electrode pattern and having a second thickness greater than the first thickness in a second region corresponding to the pad electrode, by using a halftone mask; forming the gate electrode, the first electrode pattern, and the pad electrode inside where each of the first, second, and third conductive layers are sequentially stacked, by using the first photosensitive layer pattern as a mask; forming a second photosensitive layer pattern having a third thickness in the second region, by removing the first photosensitive layer pattern by as much as the first thickness; and removing the third conductive layer positioned in an upper portion of the first region by using the second photosensitive layer pattern as a mask to form the gate electrode including the first conductive layer that serves as the lower gate electrode and the second conductive layer that serves as the upper gate electrode, the first electrode pattern including the first and second conductive layers, and the pad electrode including the first conductive layer that serves as the first pad electrode, the second conductive layer that serves as the second pad electrode, and the third conductive layer that serves as the third pad electrode.

The method may further comprise, after the second mask process, generating polycrystal indium tin oxide (p-ITO) by annealing the third pad electrode.

The method may further comprise, after the second mask process, forming a source area and a drain area by doping the active layer with impurities.

In the third mask process, the hole may be formed in the second insulation layer so that an edge of the pad electrode is not exposed and at least a center portion of the pad electrode is exposed.

A portion of the pad electrode exposed via the hole may be electrically connected to a driver IC which supplies a current, in order to drive the organic light-emitting display device.

The fourth mask process may comprise forming a fourth conductive layer on the second insulation layer; forming the source electrode and the drain electrode by patterning the fourth conductive layer; and forming the pixel electrode comprising the first conductive layer, by removing the second conductive layer constituting the first electrode pattern.

The first mask process may further comprise forming the lower capacitor electrode in the same layer as the layer in which the active layer is formed. The second mask process may further comprise forming the upper capacitor electrode on an upper surface of the lower capacitor electrode.

The method may further comprise, after the fifth mask process, forming an intermediate layer including an emission layer, and an opposite electrode on an upper surface of the pixel electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
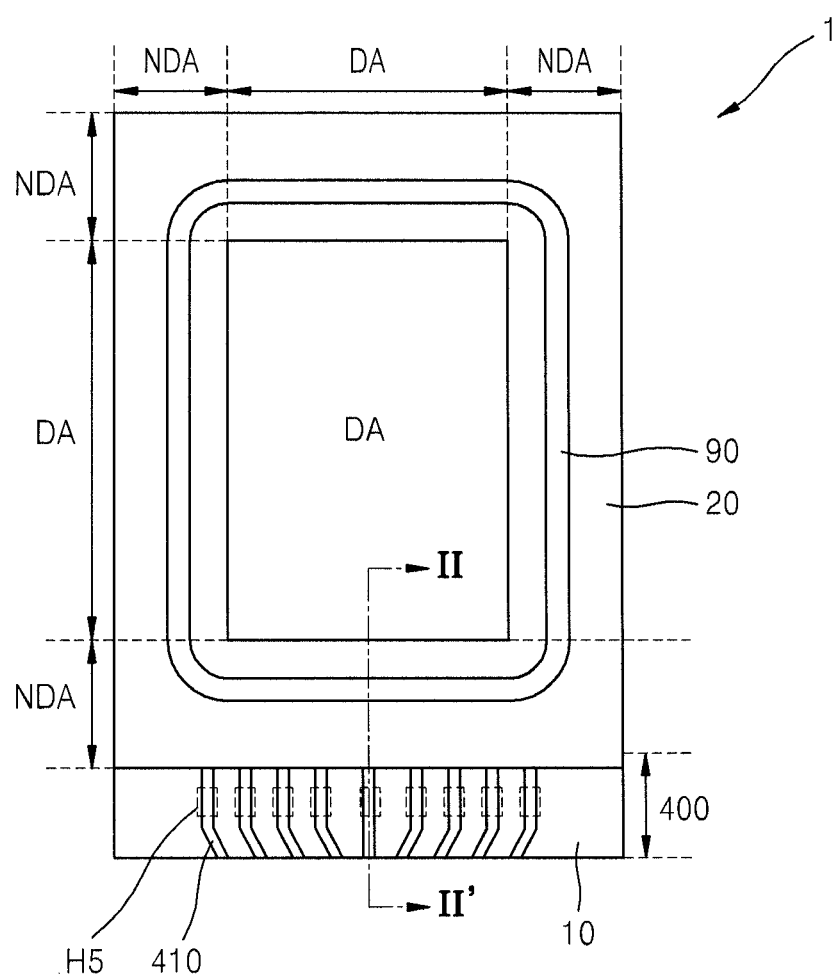
FIG. 1 is a plan view of an organic light-emitting display device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the following description of the present invention, a detailed description of disclosed technologies will not be provided if they are deemed to make features of the invention obscure.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present invention will now be described more fully with reference to the accompanying drawings in which exemplary embodiments of the invention are shown.

FIG. 1 is a plan view of an organic light-emitting display device 1 according to an embodiment of the present invention.

Referring to FIG. 1, the organic light-emitting display device 1 includes a first substrate 10 including a plurality of light-emitting pixels, and a second substrate 20 attached to the first substrate 10 by sealing.

A thin film transistor (TFT), an organic light-emitting diode (OLED), a capacitor Cst, and the like may be formed on the first substrate 10. The first substrate 10 may be a low temperature polycrystalline silicon (LTPS) substrate, a glass substrate, a plastic substrate, or the like.

The second substrate 20 may be an encapsulation substrate disposed on the first substrate 10 to protect the TFT, the light-emitting pixels, and the like formed on the first substrate 10 from external moisture, air, and the like. The second substrate 20 is positioned to face the first substrate 10, and the first substrate 10 and the second substrate 20 are joined together by a sealing member 90 disposed along the edge of the second substrate 20. The second substrate 20 may be a glass substrate, a plastic substrate, or a Steel Use Stainless (SUS) substrate.

The first substrate 10 includes a display area DA in which light is emitted, and a non-display area NDA surrounding the display area DA. According to embodiments of the present invention, the sealing member 90 is arranged in the non-display area NDA surrounding the display area DA and joins the first substrate 10 to the second substrate 20.

As described above, the OLED, the TFT driving the OLED, and wiring electrically connected to the OLED and the TFT are formed in the display area DA of the first substrate 10. The non-display area NDA may include a pad region 400 where a pad electrode 410 extending from the wiring of the display area DA is positioned.

Figure 2:
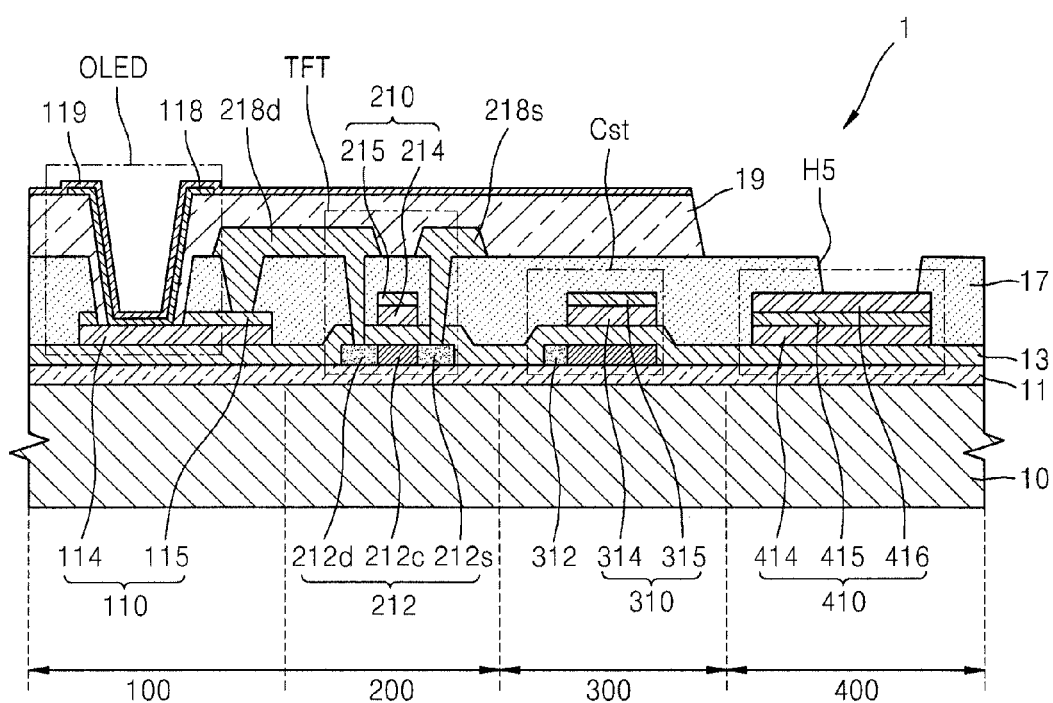
FIG. 2 is a cross-sectional view taken along line II-II' of FIG. 1.

FIG. 2 is a cross-sectional view taken along line II-II' of FIG. 1.

Referring to FIG. 2, the organic light-emitting display device 1 includes a light-emitting region 100, a transistor region 200, a storage region 300, and the pad region 400.

The transistor region 200 includes the TFT serving as a driving device. The TFT includes an active layer 212, a gate electrode 210, a source electrode 218s and a drain electrode 218d. The gate electrode 210 includes a lower gate electrode 214 and an upper gate electrode 215 formed on an upper surface of the lower gate electrode 214. The lower gate electrode 214 may be formed of a transparent conductive material. The upper gate electrode 215 may be formed of a low-resistance metal. A first insulation layer 13 as a gate insulation layer is interposed between the gate electrode 210 and the active layer 212 to insulate the gate electrode 210 from the active layer 212. A source area 212s and a drain area 212d, which are doped with highly-concentrated impurities, are formed on both edges, respectively, of the active layer 212, and are connected to the source and drain electrodes 218s and 218d, respectively.

The storage region 300 includes the capacitor Cst. The capacitor Cst is electrically connected to the TFT and stores a signal which is applied to the TFT. The capacitor Cst includes a lower capacitor electrode 312 and an upper capacitor electrode 310, and the first insulation layer 13 as a dielectric layer is interposed between the lower capacitor electrode 312 and the upper capacitor electrode 310. The lower capacitor electrode 312 may be formed on the same layer as the layer on which the active layer 212 of the TFT is formed. The lower capacitor electrode 312 is formed of a semiconductor material, and is doped with impurities to increase electrical conductivity. On the other hand, the upper capacitor electrode 310 includes a first upper capacitor electrode 314 formed of the same material as that used to form the lower gate electrode 214 of the TFT, on the same layer as that on which the lower gate electrode 214 is formed, and includes a second upper capacitor electrode 315 formed of the same material as that used to form the upper gate electrode 215 of the TFT, on the same layer as that on which the upper gate electrode 215 is formed.

The light-emitting region 100 includes the OLED. The OLED emits light by a current supplied to both electrodes of the OLED. The OLED includes a pixel electrode 114 connected to the source or drain electrode 218s or 218d of the TFT, an opposite electrode 119 formed to face the pixel electrode 114, and an intermediate layer 118 interposed between the pixel electrode 114 and the opposite electrode 119. The pixel electrode 114 may be formed of a transparent conductive material, or may be formed of the same material as that used to form the lower gate electrode 214 or the like, and on the same layer as that on which the lower gate electrode 214 or the like is formed.

The pad region 400 includes the pad electrode 410. Although not shown, the pad electrode 410 may be electrically connected to the TFT or the OLED via wiring. The pad electrode 410 is electrically connected to a driver integrated circuit (IC) which supplies a current, in order to drive the organic light-emitting display device 1. Accordingly, the pad electrode 410 receives the current from the driver IC and transmits the current to the TFT or the OLED both located in the display area DA (see FIG. 1) via the wiring. The pad electrode 410 includes a first pad electrode 414, a second pad electrode 415 formed on an upper surface of the first pad electrode 414, and a third pad electrode 416 formed on an upper surface of the second pad electrode 415. The first pad electrode 414 is formed of the same material as that used to form the lower gate electrode 214, in the same layer as that where the lower gate electrode 214 is formed. The second pad electrode 415 is formed of the same material as that used to form the upper gate electrode 215, in the same layer as that where the upper gate electrode 215 is formed. The third pad electrode 416 includes a transparent conductive oxide (TCO). The third pad electrode 416 may be formed of polycrystal indium tin oxide (p-ITO). This is because the third pad electrode 416 may be used as an etching stopper during manufacturing of the organic light-emitting display device 1, and corrosion resistance of a pad region of a final product is increased.

According to an embodiment of the present invention, the pad electrode 410 includes a first pad electrode 414, a second pad electrode 415, and a third pad electrode 416 sequentially stacked on top of one another, wherein the first pad electrode 414 includes a transparent conductive oxide, the second pad electrode 415 includes a low-resistance metal, and the third pad electrode 416 includes p-ITO. According to this structure, a voltage is applied to the display area DA of FIG. 1 via the second pad electrode 415 having low resistance, thereby improving resistance saturation and reducing the entire resistance during voltage application. In addition, since the third pad electrode 416, which is resilient to corrosion and difficult to etch, exists on an upper surface of the second pad electrode 415, it protects the second pad electrode 415 that is corroded more easily than the third pad electrode 416, thereby increasing the corrosion resistance of the pad region 400.

FIGS. 3 through 14 are cross-sectional views for describing a method of manufacturing the organic light-emitting display device 1 of FIG. 2. The method of manufacturing the organic light-emitting display device 1 of FIG. 2 will now be described schematically.

Figure 3:
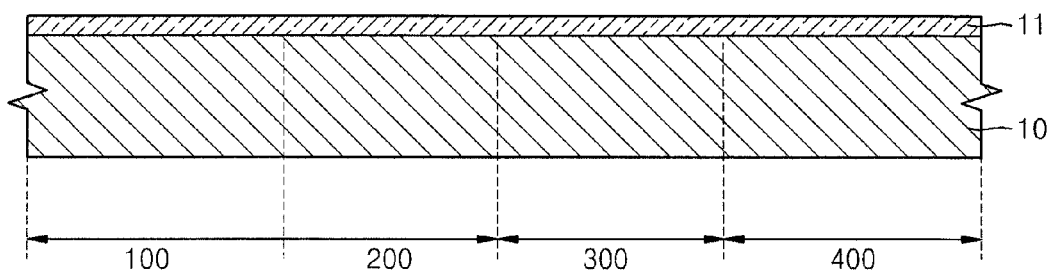
FIGS. 3 through 14 are cross-sectional views for describing a method of manufacturing the organic light-emitting display device of FIG. 2.

First, as shown in FIG. 3, an auxiliary layer 11 is formed on the first substrate 10. The first substrate 10 may be formed of a transparent glass material containing $SiO_2$ as a main component. However, the first substrate 10 is not limited thereto. The first substrate 10 may be any substrate formed of various materials, for example, a transparent plastic, a metal, or the like.

The auxiliary layer 11, for example, a barrier layer, a blocking layer, and/or a buffer layer, may be formed on an upper surface of the first substrate 10 to reduce or prevent diffusion of impurity ions and penetration of moisture or external air and to planarize the upper surface of the first substrate 10. The auxiliary layer 11 may be formed using, for example, $SiO_2$ and/or $SiN_x$, according to any of various suitable deposition methods, for example, plasma enhanced chemical vapor deposition (PECVD), atmospheric pressure CVD (APCVD), and/or low pressure CVD (LPCVD).

Figure 4:
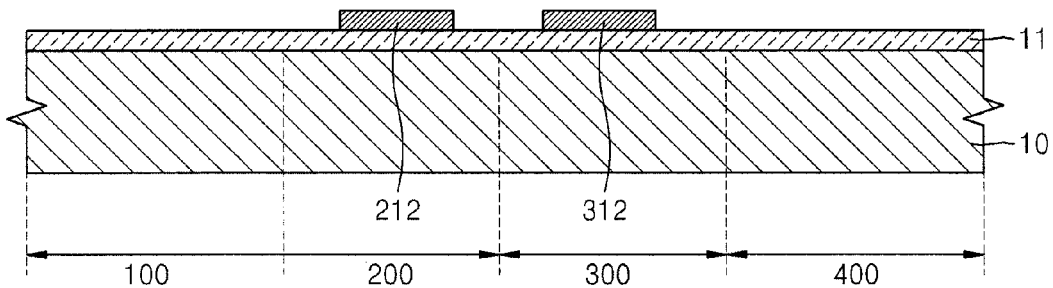

Next, as shown in FIG. 4, the active layer 212 of the TFT and the lower capacitor electrode 312 are formed on an upper surface of the auxiliary layer 11. In detail, an amorphous silicon layer is first formed on the upper surface of the auxiliary layer 11 and then crystallized to generate a polycrystalline silicon layer. Amorphous silicon may be crystallized using any of various methods such as rapid thermal annealing (RTA), solid phase crystallization (SPC), excimer laser annealing (ELA), metal induced crystallization (MIC), metal induced lateral crystallization (MILC), and sequential lateral solidification (SLS). The polycrystalline silicon layer is patterned to form the active layer 212 of the TFT and the lower capacitor electrode 312 by using a mask process using a first mask.

Although the active layer 212 and the lower capacitor electrode 312 are separated from each other in the present embodiment, the active layer 212 and the lower capacitor electrode 312 may be integrally formed.

Figure 5:
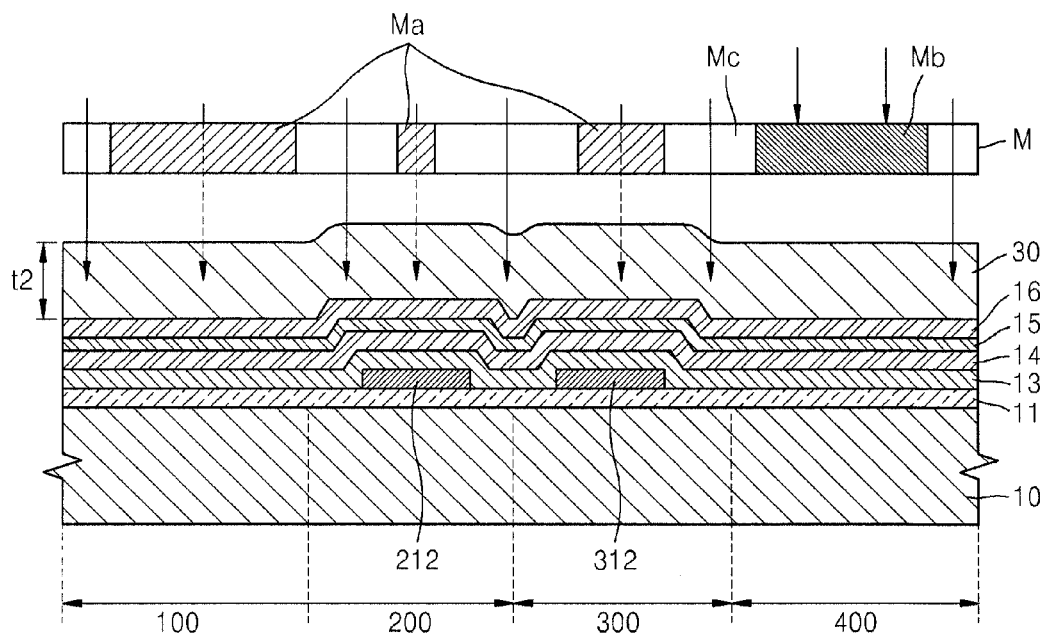

Next, as shown in FIG. 5, the first insulation layer 13, a first conductive layer 14, a second conductive layer 15, and a third conductive layer 16 are sequentially formed on the entire surface of the first substrate 10 on which the active layer 212 and the lower capacitor electrode 312 have been formed.

The first insulation layer 13 may be obtained by depositing an inorganic insulation material such as $SiN_x$ or $SiO_x$, according to a suitable method such as PECVD, APCVD, and/or LPCVD. The first insulation layer 13 is disposed between the active layer 212 and the gate electrode 210 of the TFT to serve as a gate insulation layer of the TFT, and between the upper capacitor electrode 310 and the lower capacitor electrode 312 to serve as a dielectric layer of the capacitor Cst.

The first conductive layer 14 may include at least one selected from among transparent materials such as ITO, IZO, ZnO, and $In_2O_3$. Thereafter, the first conductive layer 14 may be patterned to form the pixel electrode 114, the lower gate electrode 214, the first upper capacitor electrode 314, and the first pad electrode 414. Since the organic light-emitting display device 1 according to an embodiment of the present invention is a bottom emission type that emits light toward a substrate, the pixel electrode 114 needs to be formed as a transparent electrode. Accordingly, the first conductive layer 14 used to form the pixel electrode 114 may be formed of TCO.

The second conductive layer 15 may include at least one selected from among silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and copper (Cu). The second conductive layer 15 may have a three-layered structure, namely, a Mo—Al—Mo structure. Then, the second conductive layer 15 may be patterned to form the upper gate electrode 215 and the second pad electrode 415. According to an embodiment of the present invention, since the gate electrode 210 and the pad electrode 410 need to smoothly transmit a current, the formation of the gate electrode 210 and the pad electrode 410 from only the first conductive layer 14 having relatively high resistance may be a problem. Accordingly, the second conductive layer 15 formed of a low-resistance metal having smaller resistance than a low-resistance metal used to form the first conductive layer 14 should be formed to allow the TFT and the pad electrode 410 to perform their respective functions.

The third conductive layer 16 may include at least one selected from among transparent materials such as ITO, IZO, ZnO, and $In_2O_3$. Then, the third conductive layer 16 may remain in only the pad electrode 410 and thus may be patterned to form the third pad electrode 416. The third conductive layer 16 may be formed of amorphous ITO (a-ITO), and then may be transformed into p-ITO by annealing. Annealing may be performed using heat, ultraviolet rays (UV), and/or a laser. Even when annealing is not performed, the a-ITO may be crystallized via thermal treatment and UV treatment during the manufacturing of the organic light-emitting display device 1. Due to the transformation of the third conductive layer 16 into p-ITO, a specific resistance value of the third conductive layer 16 is reduced to be between about 250 Ωcm and about 300 Ωcm, as compared with the a-ITO having a specific resistance value greater than about 1,000 Ωcm. The etching speed of the p-ITO is reduced to about 1/10 or less of the etching speed of the a-ITO. The etching speed of the p-ITO is reduced not only with respect to an aqueous solution of HCl and $HNO_3$ used as etchants for wet-etching ITO, but also with respect to an aqueous fluoric acid (HF) solution, an aqueous nitric acid ($HNO_3$) solution and an aqueous acetic acid (CHCHOOH) solution. In other words, a third pad electrode including p-ITO may be used as an etching stopper during the manufacturing of the organic light-emitting display device 1, and is not easily eroded even when it is exposed to light after the process.

Referring to FIGS. 5 through 9, a first electrode pattern 110 for forming the pixel electrode 114, the upper capacitor electrode 310, the gate electrode 210, and the pad electrode 410 are formed on the first substrate 10.

In detail, the first conductive layer 14, the second conductive layer 15, and the third conductive layer 16 sequentially stacked on the entire surface of the first substrate 10 may be patterned according to a mask process using a halftone mask M.

First, referring to FIG. 5, the first, second, and third conductive layers 14, 15, and 16 are patterned using the halftone mask M.

The halftone mask M is also referred to as a diffraction mask, and includes a blocking area Mb for blocking light, a semi-transmitting area Ma for transmitting only part of the light, and a transmitting area Mc for transmitting all of the light. A photosensitive layer 30 is coated on an upper surface of the third conductive layer 16 and has a second thickness t2, the blocking area Mb of the halftone mask M is arranged in the pad region 400 where the pad electrode 410 is to be formed, and the semi-transmitting area Ma of the halftone mask M is arranged in the transistor region 200 where the gate electrode 210 is to be formed, the storage region 300 where the upper capacitor electrode 310 has been formed, and the light-emitting region 100 where the pixel electrode 114 is to be formed. Next, a resultant structure is subjected to light such as UV and is developed.

Figure 6:
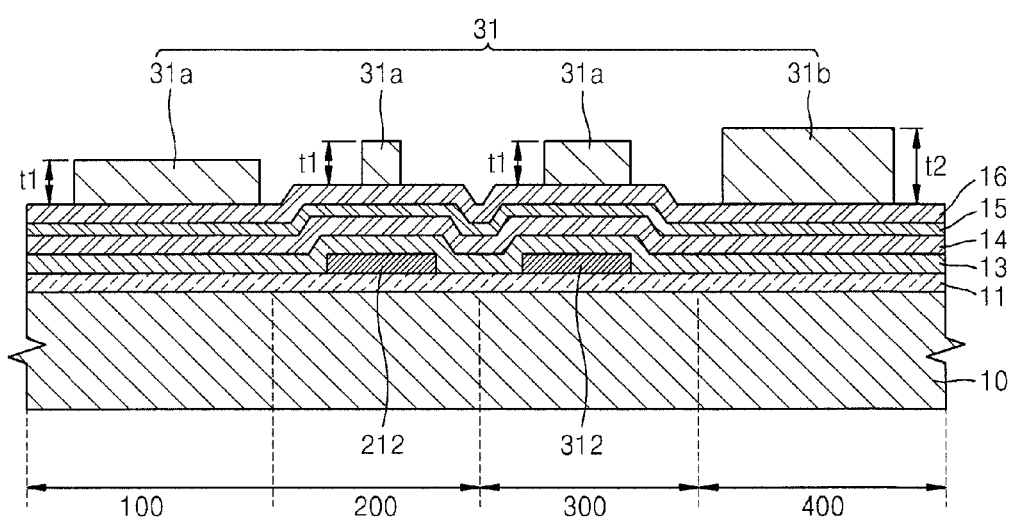

Referring to FIG. 6, a portion of the photosensitive layer 30 corresponding to the transmitting area Mc is completely removed, a photosensitive layer 31a corresponding to the semi-transmitting area Ma remains and has a first thickness t1, and a photosensitive layer 31b corresponding to the blocking area Mb remains as it is, namely, remains and has the second thickness t2. The first thickness t1 is less than the second thickness t2, because a certain amount of light is projected to the semi-transmitting area Ma. For example, the second thickness t2 may be a thickness of the third conductive layer 16, which is greater than the first thickness t1. A photosensitive layer pattern illustrated in FIG. 6 is referred to as a first photosensitive layer pattern 31, for convenience of explanation.

Figure 7:
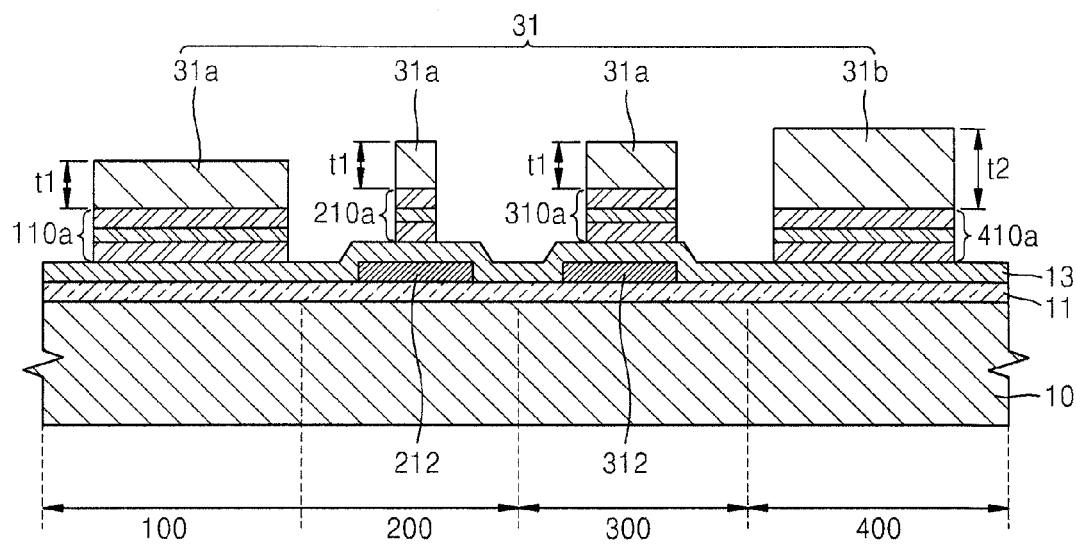

Next, referring to FIG. 7, the first conductive layer 14, the second conductive layer 15, and the third conductive layer 16 are patterned via etching by using the first photosensitive layer pattern 31 as a mask, thereby forming a first electrode pattern 110a, a gate electrode 210a, an upper capacitor electrode 310a, and a pad electrode 410a, each having three conductive layers.

Figure 8:
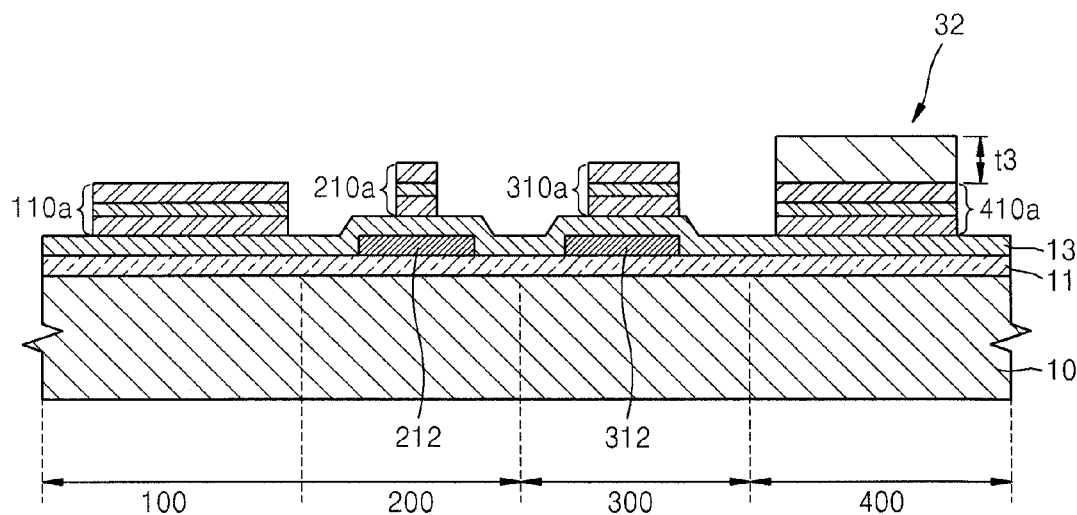

Next, referring to FIG. 8, the first photosensitive layer pattern 31 is removed by as much as the first thickness t1 by ashing. Accordingly, the photosensitive layer pattern 31a in an area for forming the first electrode pattern 110, the gate electrode 210, and the upper capacitor electrode 310 is completely removed, and only a photosensitive layer pattern 32 having a third thickness t3 remains on the upper surface of the pad electrode 410. The third thickness t3 is obtained as a result of removal of the first thickness t1 from the second thickness t2, and the photosensitive layer pattern 32 of FIG. 8 is referred to as a second photosensitive layer pattern 32 for convenience of explanation.

Figure 9:
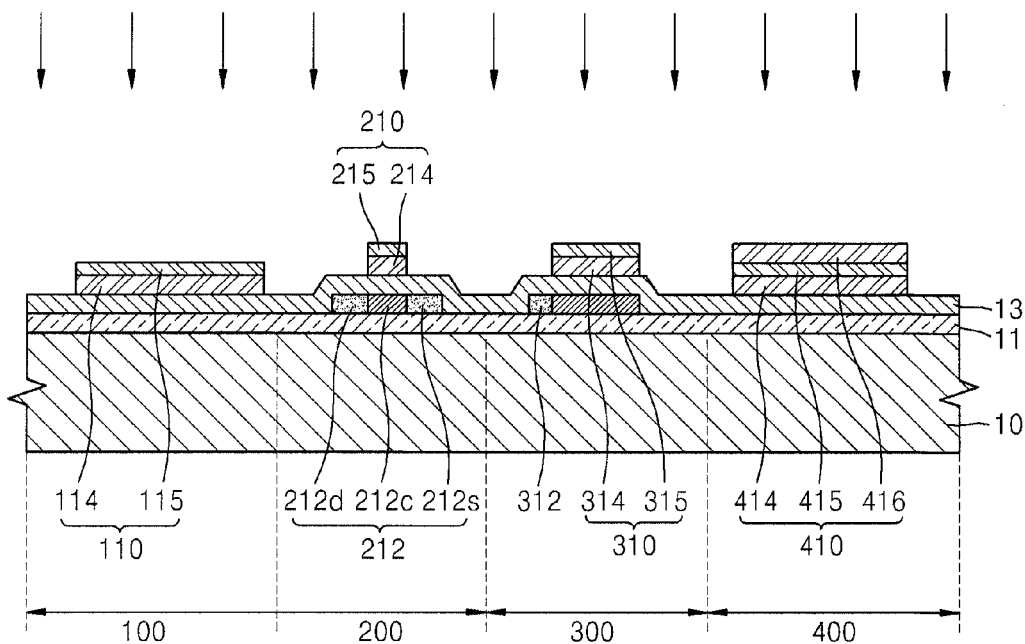

Next, referring to FIG. 9, portions of the third conductive layer 16 respectively corresponding to upper portions of the electrode pattern 110a, the gate electrode 210a, and the upper capacitor electrode 310a, each having three conductive layers, are removed via etching by using the second photosensitive layer pattern 32 as a mask. Accordingly, the gate electrode 210 having the first conductive layer 14 that serves as the lower gate electrode 214 and the second conductive layer 15 that serves as the upper gate electrode 215, and the first electrode pattern 110 having the first conductive layer 14 as a lower layer to become the pixel electrode 114 and the second conductive layer 15 as an upper layer 115, are generated. In the pad region, there remain the pad electrode 410 having the first conductive layer 14 that serves as the first pad electrode 414, the second conductive layer 15 that serves as the second pad electrode 415, and the third conductive layer 16 that serves as the third pad electrode 416.

The gate electrode 210 is formed to be aligned with the center of the active layer 212, and the active layer 212 is doped with n-type or p-type impurities by using the gate electrode 210 as a self-aligned mask to form the source and drain areas 212s and 212d on an edge of the active layer 212 corresponding to both sides of the gate electrode 210 and to form a channel area 212c between the source and drain areas 212s and 212d. The impurities may be boron (B) ions or phosphorus (P) ions.

Figure 10:
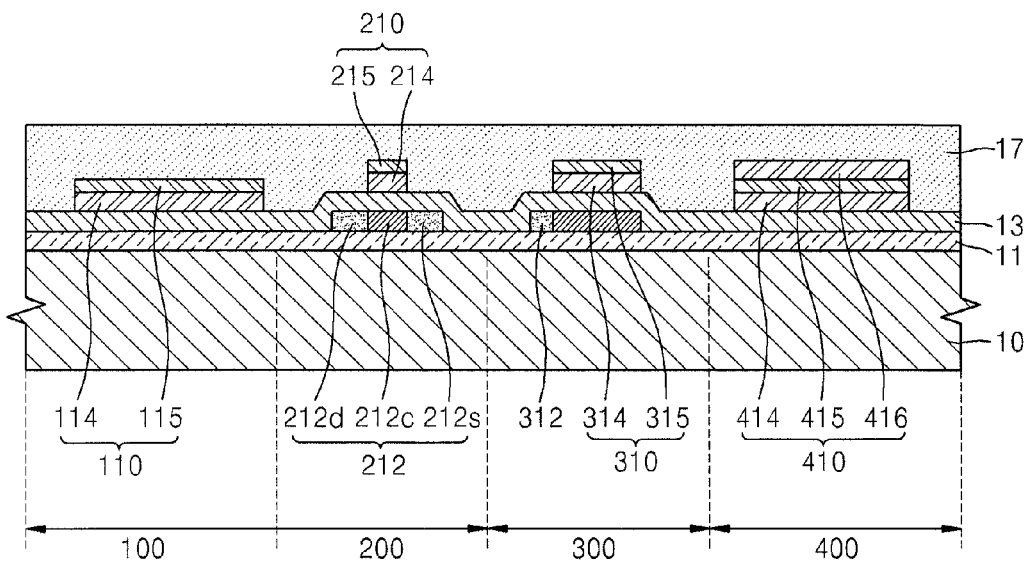

Next, as illustrated in FIG. 10, a second insulation layer 17 is formed on the entire surface of the first substrate 10 on which the gate electrode 210 has been formed.

The second insulation layer 17 is formed of at least one organic insulation material selected from the group consisting of polyimide, polyamide (PA), acryl resin, benzocyclobutene (BCB) and phenolic resin by using a method such as spin coating. The second insulation layer 17 is formed to have a sufficient thickness, for example, to be thicker than the first insulation layer 13, and is utilized as an interlayer insulation layer between the gate electrode 210 and the source and drain electrodes 218s and 218d of the TFT. The second insulation layer 17 may be formed of not only the above-described organic insulation material, but also of an inorganic insulation material such as the above-described inorganic material used to form the first insulation layer 13. Alternatively, the second insulation layer 17 may be formed by alternating an organic insulation material with an inorganic insulation material.

Figure 11:
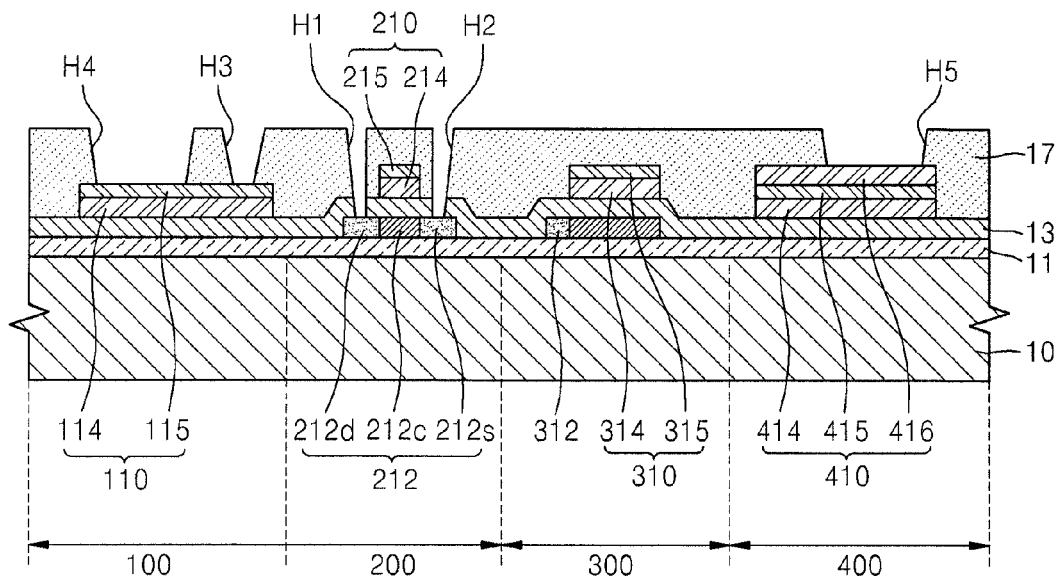

Next, as illustrated in FIG. 11, the second insulation layer 17 is patterned to form an interlayer insulation layer 17 including holes (a third hole H3 and a fourth hole H4) H3 and H4 exposing the first electrode pattern 110, contact holes (a first hole H1 and a second hole H2) exposing parts of the source and drain areas 212s and 212d of the active layer 212, and a hole (a fifth hole H5) exposing the pad electrode 410.

In detail, the second insulation layer 17 is patterned according to a mask process using a third mask to thereby form the holes H1, H2, H3, H4, and H5. The first hole H1 and the second hole H2 expose parts of the source and drain areas 212s and 212d, respectively, and the third hole H3 and the fourth hole H4 expose at least a part of the second conductive layer 15 constituting an upper portion (e.g., the upper layer 115) of the first electrode pattern 110. The fifth hole H5 exposes at least a part of the third conductive layer 16 constituting an upper portion (e.g., the third pad electrode 416) of the pad electrode 410.

As illustrated in FIG. 11, the fifth hole H5 is formed to not expose lateral surfaces of the pad electrode 410, thereby protecting the lateral surfaces from an external impact and thus prevent or protect the pad electrode from being eroded.

Figure 12:
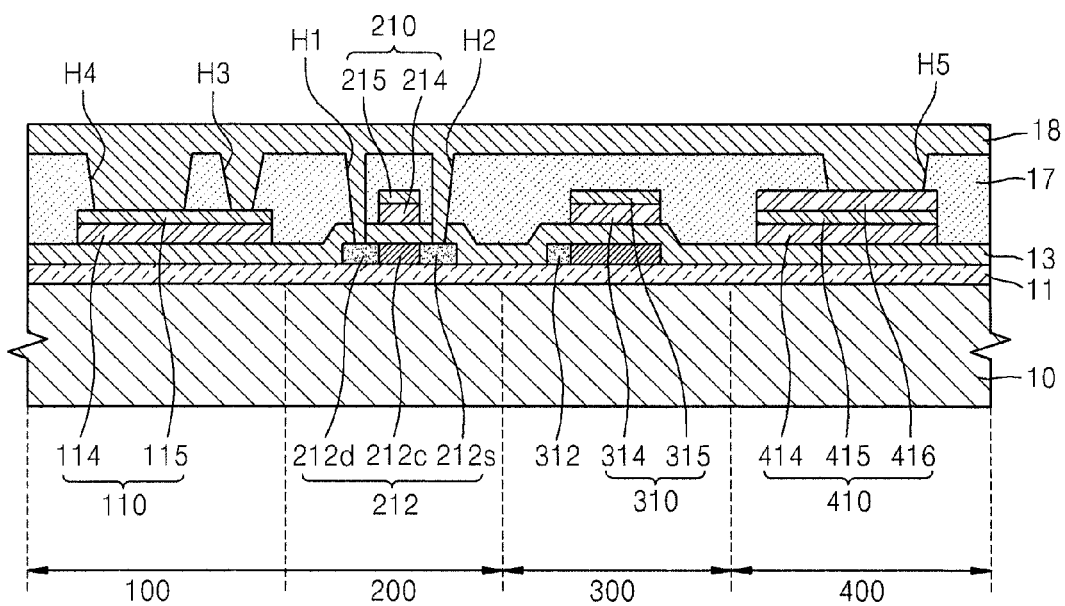

Next, as illustrated in FIG. 12, a fourth conductive layer 18 is formed on the entire surface of the first substrate 10 so as to cover the interlayer insulation layer 17.

The fourth conductive layer 18 may be formed of one selected from the conductive materials used to form the first, second, and third conductive layers 14, 15, and 16, but the fourth conductive layer 18 is not limited thereto and may be formed of any of various other suitable conductive materials. The selected conductive material is deposited to a sufficient thickness enough to fill the holes H1, H2, H3, H4, and H5.

Figure 13:
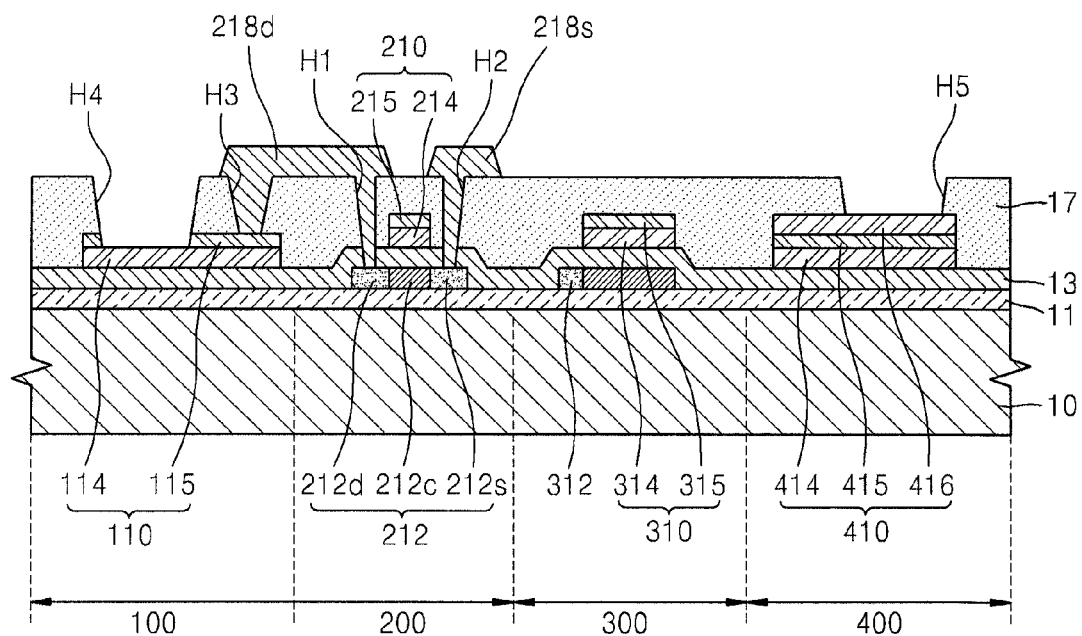

Next, as illustrated in FIG. 13, the fourth conductive layer 18 of FIG. 12 is patterned to form the source and drain electrodes 218s and 218d and to expose and form the pixel electrode 114.

In detail, the fourth conductive layer 18 of FIG. 12 is patterned according to a mask process using a fourth mask to thereby form the source and drain electrodes 218s and 218d.

One electrode selected from the source and drain electrodes 218s and 218d (the drain electrode 218d of the present embodiment) is formed to contact the pixel electrode 114 via the third hole H3 in an edge area of the second conductive layer 15 in FIG. 6) as an upper layer 115 corresponding to the upper portion of the first electrode pattern 110 of FIG. 12 in which the pixel electrode 114 is to be formed.

The pixel electrode 114 is exposed and formed at the same time when the source and drain electrodes 218s and 218d are formed. However, the present invention is not limited thereto, and the pixel electrode 114 may be exposed and formed via additional etching after the source and drain electrodes 218s and 218d are formed. In detail, the first electrode pattern 110 of FIG. 12 forms the pixel electrode 114 by removal of the second conductive layer 15 exposed via the fourth hole H4. Accordingly, the lower gate electrode 214 and the pixel electrode 114 are formed from an identical layer, and thus, are formed of the same material.

The upper capacitor electrode 310 is not exposed due to being covered with the second insulation layer 17, but the present invention is not limited thereto. For example, a hole via which a part or all of the upper capacitor electrode 310 is exposed may be formed in the second insulation layer 17 in FIG. 11, and the second conductive layer 15 of the upper capacitor electrode 310 exposed via the hole may be removed in FIG. 13. After the second conductive layer 15 constituting the upper capacitor electrode 310 is removed, a process of doping the lower capacitor electrode 312 with impurities may be additionally performed to improve electrical conductivity of the lower capacitor electrode 312.

Figure 14:
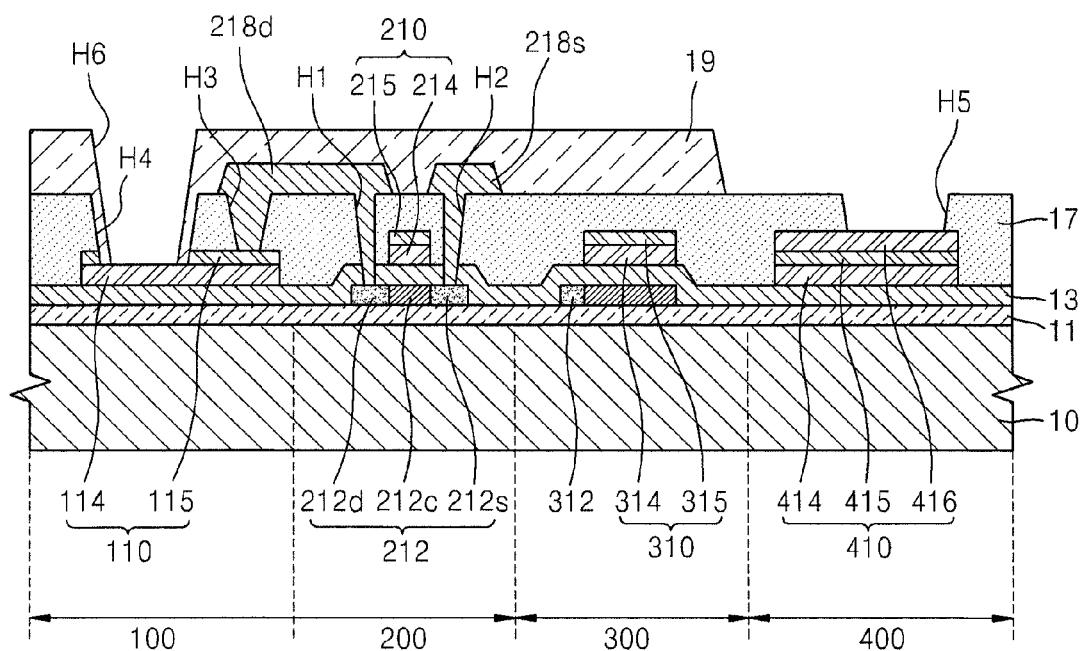

Next, as illustrated in FIG. 14, a pixel definition layer (PDL) 19 is formed on the first substrate 10.

In more detail, a third insulation layer 19 is formed on the entire surface of the first substrate 10 on which the pixel electrode 114 and the source and drain electrodes 218s and 218d have been formed. The third insulation layer 19 may be formed of at least one organic insulation material selected from the group consisting of polyimide, polyamide (PA), acryl resin, benzocyclobutene (BCB) and phenolic resin by using a method such as spin coating. The third insulation layer 19 may be formed of an inorganic insulation material selected from the group consisting of $SiO_2$, $SiN_x$, $Al_2O_3$, $CuO_x$, $Tb_4O_7$, $Y_2O_3$, $Nb_2O_5$, and $Pr_2O_3$ instead of the above-described organic insulation material. The third insulation layer 19 may have a multi-layered structure by alternating an organic insulation material with an inorganic insulation material.

The third insulation layer 19 may be formed or not formed in the pad region 400 according to circumstances. Even if the third insulation layer 19 is formed in the pad region 400, a hole exposing the pad electrode 410 may be further formed according to a mask process using a fifth mask.

The third insulation layer 19 is patterned according to a mask process using the fifth mask to thereby form a sixth hole H6 exposing a center portion of the pixel electrode 114. In this way, a pixel is defined.

Thereafter, as illustrated in FIG. 2, the intermediate layer 118 including an emission layer, and the opposite electrode 119 are formed in the sixth hole H6 exposing the pixel electrode 114.

The intermediate layer 118 may be formed by stacking an organic emission layer (EML) and at least one functional layer selected from the group consisting of a hole injection layer (HIL), a hole transport layer (HTL), an electron transport layer (ETL), and an electron injection layer (EIL).

The organic emission layer may be formed of a low-molecular weight organic material or a high-molecular weight organic polymer.

When the organic emission layer is formed of the low-molecular weight organic material, the intermediate layer 118 is obtained by stacking the hole transport layer (HTL), the hole injection layer (HIL) and the like on a surface of the organic emission layer facing the pixel electrode 114, and by stacking the electron transport layer (ETL), the electron injection layer (EIL) and the like on a surface of the organic emission layer facing the opposite electrode 119. Various other suitable layers may be stacked if necessary. Examples of organic materials that may be used to form the organic emission layer include any of various suitable materials such as copper phthalocyanine (CuPc), N,N'-di(naphthalene-1-yl)-N,N'-diphenyl-benzidine (NPB), and tris-8-hydroxyquinoline aluminum (Alq3).

On the other hand, when the organic emission layer is formed of a high-molecular weight organic material, the intermediate layer 118 may be formed by stacking only a hole transport layer (HTL) on the surface of the organic emission layer facing the pixel electrode 114. The hole transport layer (HTL) may be formed of poly-(2,4)-ethylene-dihydroxy thiophene (PEDOT), polyaniline (PANI), or the like on the upper surface of the pixel electrode 114 by inkjet printing or spin coating. High-molecular weight organic materials such as polyphenylenevinylenes (PPVs) and polyfluorenes may be used as the organic materials that may be used to form the organic emission layer. A color pattern may be formed by using a typical method such as inkjet printing, spin coating, or a thermal transfer method that uses a laser.

The opposite electrode 119 may be formed on the entire surface of the first substrate 10 so as to serve as a common electrode. In the organic light-emitting display device 1 according to the present embodiment, the pixel electrode 114 is used as an anode electrode, and the opposite electrode 119 is used as a cathode electrode. Alternatively, the pixel electrode 114 may be used as a cathode electrode, and the opposite electrode 119 may be used as an anode electrode.

When the organic light-emitting display device 1 is a bottom emission type displaying an image toward the first substrate 10, the pixel electrode 114 is a transparent electrode and the opposite electrode 119 is a reflective electrode. The reflective electrode may be formed by thinly depositing a metal having a low work function, such as Ag, Mg, Al, Pt, Pd, Au, Ni, Nd, Ir, Cr, Li, Ca, LiF/Ca, LiF/Al, or a combination thereof.

A removal of a stacked layer during each mask process performed to form an organic light-emitting display device may be achieved by dry etching and/or wet etching.

According to a bottom-emission type display device according to an embodiment of the present invention, a metal layer is formed in a bottommost portion of a substrate to be separated from a pixel electrode without changing the number of masks used. Thus, light-emission efficiency of the pixel electrode is increased, and etching characteristics of a gate electrode are secured, leading to improvement in the display quality of the display device, process simplification, and failure reduction.

Although an organic light-emitting display device is illustrated in the above-described embodiment, the present invention is not limited thereto, and various suitable display devices including a liquid crystal display (LCD) may be used.

Although a single TFT and a single capacitor are illustrated in the above-described embodiment, this illustration is only for convenience of explanation and the present invention is not limited thereto. As long as the number of mask processes used is not increased, a plurality of TFTs and a plurality of capacitors may be included.

According to embodiments of the present invention, an organic light-emitting display device is simply manufactured and includes a pad portion with increased corrosion-resistance and reduced resistance, whereby the reliability of the organic light-emitting display device is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device, the method comprising:
   a first mask process of forming an active layer of a thin film transistor (TFT) on a substrate;
   a second mask process of sequentially stacking a first insulation layer, a first conductive layer, a second conductive layer, and a third conductive layer on an upper surface of the active layer and then patterning the first conductive layer, the second conductive layer, and the third conductive layer to form:
      a gate electrode comprising the first conductive layer that serves as a lower gate electrode and the second conductive layer that serves as an upper gate electrode,
      a first electrode pattern comprising the first and second conductive layers, and
      a pad electrode comprising the first conductive layer that serves as a first pad electrode, the second conductive layer that serves as a second pad electrode, and the third conductive layer that serves as a third pad electrode;
   a third mask process of forming a second insulation layer on upper surfaces of the gate electrode, the first electrode pattern, and the pad electrode and then forming holes exposing a part of the active layer via patterning of the first and second insulation layers and holes exposing at least a part of the first electrode pattern and the pad electrode via patterning of the second insulation layer;
   a fourth mask process of forming a source electrode and a drain electrode that contact the active layer via the holes and forming a pixel electrode from the first electrode pattern; and
   a fifth mask process of forming a pixel definition layer exposing at least a part of the pixel electrode.

2. The method of claim 1, wherein the second mask process comprises:
   sequentially stacking the first insulation layer, the first conductive layer, the second conductive layer, and the third conductive layer on the upper surface of the active layer;

forming a first photosensitive layer pattern having a first thickness in a first region corresponding to the gate electrode and the first electrode pattern, and having a second thickness greater than the first thickness in a second region corresponding to the pad electrode, by using a halftone mask;

forming the gate electrode, the first electrode pattern, and the pad electrode inside where each of the first, second, and third conductive layers are sequentially stacked, by using the first photosensitive layer pattern as a mask;

forming a second photosensitive layer pattern having a third thickness in the second region, by removing the first photosensitive layer pattern by as much as the first thickness; and removing the third conductive layer positioned in an upper portion of the first region by using the second photosensitive layer pattern as a mask to form:

the gate electrode comprising the first conductive layer that serves as the lower gate electrode and the second conductive layer that serves as the upper gate electrode, the first electrode pattern comprising the first and second conductive layers, and the pad electrode comprising the first conductive layer that serves as the first pad electrode, the second conductive layer that serves as the second pad electrode, and the third conductive layer that serves as the third pad electrode.

3. The method of claim 1, after the second mask process, further comprising generating polycrystal indium tin oxide (p-ITO) by annealing the third pad electrode.

4. The method of claim 1, after the second mask process, further comprising forming a source area and a drain area by doping the active layer with impurities.

5. The method of claim 1, wherein, in the third mask process, the hole is formed in the second insulation layer so that an edge of the pad electrode is not exposed and at least a center portion of the pad electrode is exposed.

6. The method of claim 5, wherein a portion of the pad electrode exposed via the hole is electrically connected to a driver IC which supplies a current, in order to drive the organic light-emitting display device.

7. The method of claim 1, wherein the fourth mask process comprises:

forming a fourth conductive layer on the second insulation layer;

forming the source electrode and the drain electrode by patterning the fourth conductive layer; and forming the pixel electrode comprising the first conductive layer, by removing the second conductive layer constituting the first electrode pattern.

8. The method of claim 1, wherein the first mask process further comprises forming a lower capacitor electrode in the same layer as a layer in which the active layer is formed, and the second mask process further comprises forming an upper capacitor electrode on an upper surface of the lower capacitor electrode.

9. The method of claim 1, after the fifth mask process, further comprising forming an intermediate layer comprising an emission layer, and an opposite electrode on an upper surface of the pixel electrode.

* * * * *